United States Patent [19]

Morgan

[11] Patent Number: 4,639,058
[45] Date of Patent: Jan. 27, 1987

[54] LOW PROFILE TEST CLIP AND HANDLE THEREFOR

[75] Inventor: Thomas E. Morgan, Concord, Ohio

[73] Assignee: Minnesota Mining & Manufacturing Co., St. Paul, Minn.

[21] Appl. No.: 643,237

[22] Filed: Aug. 22, 1984

[51] Int. Cl.⁴ .................... H01R 4/66; H01R 13/62
[52] U.S. Cl. .......................... 339/17 CF; 324/158 F;
    339/14 R; 339/75 M; 339/108 TP; 339/176 M;
    339/184 M
[58] Field of Search ......... 339/17 CF, 75 M, 75 MP,
    339/176 M, 176 MF, 176 MP, 218 R, 218 M,
    186 R, 186 M, 184 R, 184 M, 65, 14 R, 108 RP;
    324/158 F

[56] References Cited

U.S. PATENT DOCUMENTS

| | | | |
|---|---|---|---|
| 2,103,891 | 12/1937 | Brown | 339/108 R |
| 2,601,797 | 7/1952 | Holt, Jr. | |
| 2,699,534 | 1/1955 | Klostermann | 339/176 MP |
| 3,015,877 | 1/1962 | Francis | 339/218 R |
| 3,125,908 | 3/1964 | Rozmus | |
| 3,169,816 | 2/1965 | Hammond et al. | 339/110 R |
| 3,399,377 | 8/1968 | Warzecka | 339/176 MP |
| 3,605,060 | 9/1971 | Praeger | 339/17 F |
| 3,776,069 | 12/1973 | Mugnier | |
| 3,914,007 | 10/1975 | Seidler | 339/255 P |
| 4,012,097 | 3/1977 | Long et al. | 339/17 CF X |
| 4,105,278 | 8/1978 | Braund et al. | 339/176 MF X |
| 4,112,791 | 9/1978 | Wiener | |
| 4,130,327 | 12/1978 | Spaulding | 339/17 CF |
| 4,190,311 | 2/1980 | Basta | 339/176 MF X |
| 4,269,462 | 5/1981 | Bethurum | 339/200 P |
| 4,282,783 | 8/1981 | Fortune | 81/428 R |
| 4,326,764 | 4/1982 | Asick et al. | 339/176 MF |
| 4,366,730 | 1/1983 | Cassadio | |
| 4,395,084 | 7/1983 | Conrad | 339/17 CF X |
| 4,431,248 | 2/1984 | Huntley et al. | 339/99 R |
| 4,460,236 | 7/1984 | Strautz | 339/17 CF X |
| 4,474,418 | 10/1984 | Yamada | 339/176 M |
| 4,508,403 | 4/1985 | Weltman et al. | 339/17 CF X |
| 4,541,676 | 9/1985 | Hansen et al. | 339/17 CF |
| 4,547,028 | 10/1985 | Morgan et al. | 339/14 R |

FOREIGN PATENT DOCUMENTS

| | | | |
|---|---|---|---|
| 2147377 | 3/1973 | Fed. Rep. of Germany | 339/17 CF |
| 1291006 | 3/1962 | France | 339/176 MP |
| 52-48092 | 4/1977 | Japan | 339/176 MF |
| 1246101 | 9/1971 | United Kingdom | |
| 2084503 | 4/1982 | United Kingdom | |

Primary Examiner—Gil Weidenfeld
Assistant Examiner—Steven C. Bishop
Attorney, Agent, or Firm—Renner, Otto, Boisselle & Lyon

[57] ABSTRACT

An improved electrical clip-like connector having a low profile and being capable of connecting the conductors of an electrical cable with the leads of an integrated circuit package or the like, employs reinforcing shrouds to prevent breakage of gripping teeth and improper installation of the connector. Provision also is made for convenient and secure attachment of an external ground and for good electrical connection between contacts of the connector and the leads of the integrated circuit package that might have an oxide film on their surface. A further feature of the invention provides a less stiff and easier to use handle for installing and removing the clip whereas a still further feature of the invention provides for reinforcement of relatively wide clip bodies in the proximity of contact supporting walls.

20 Claims, 15 Drawing Figures

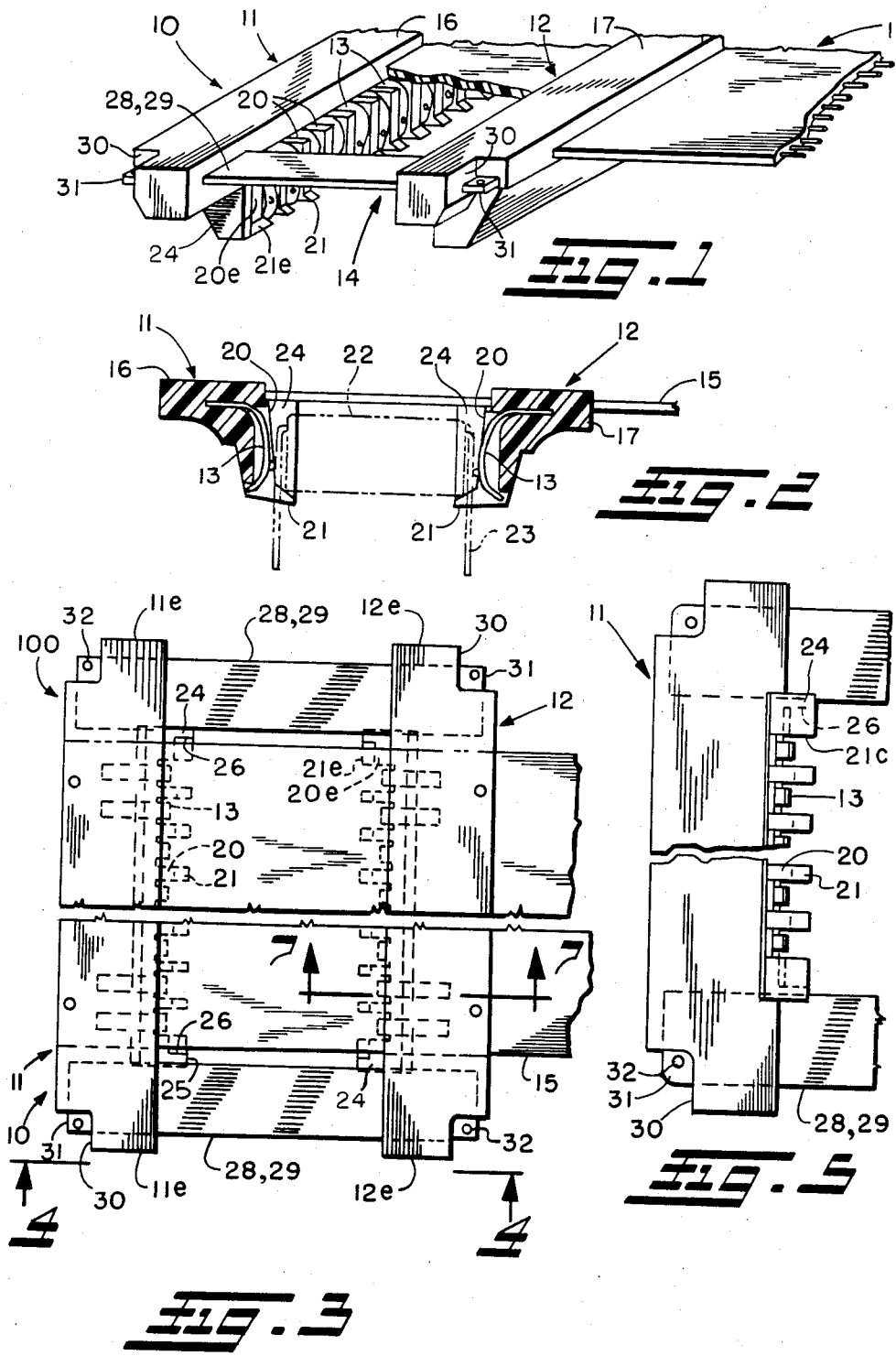

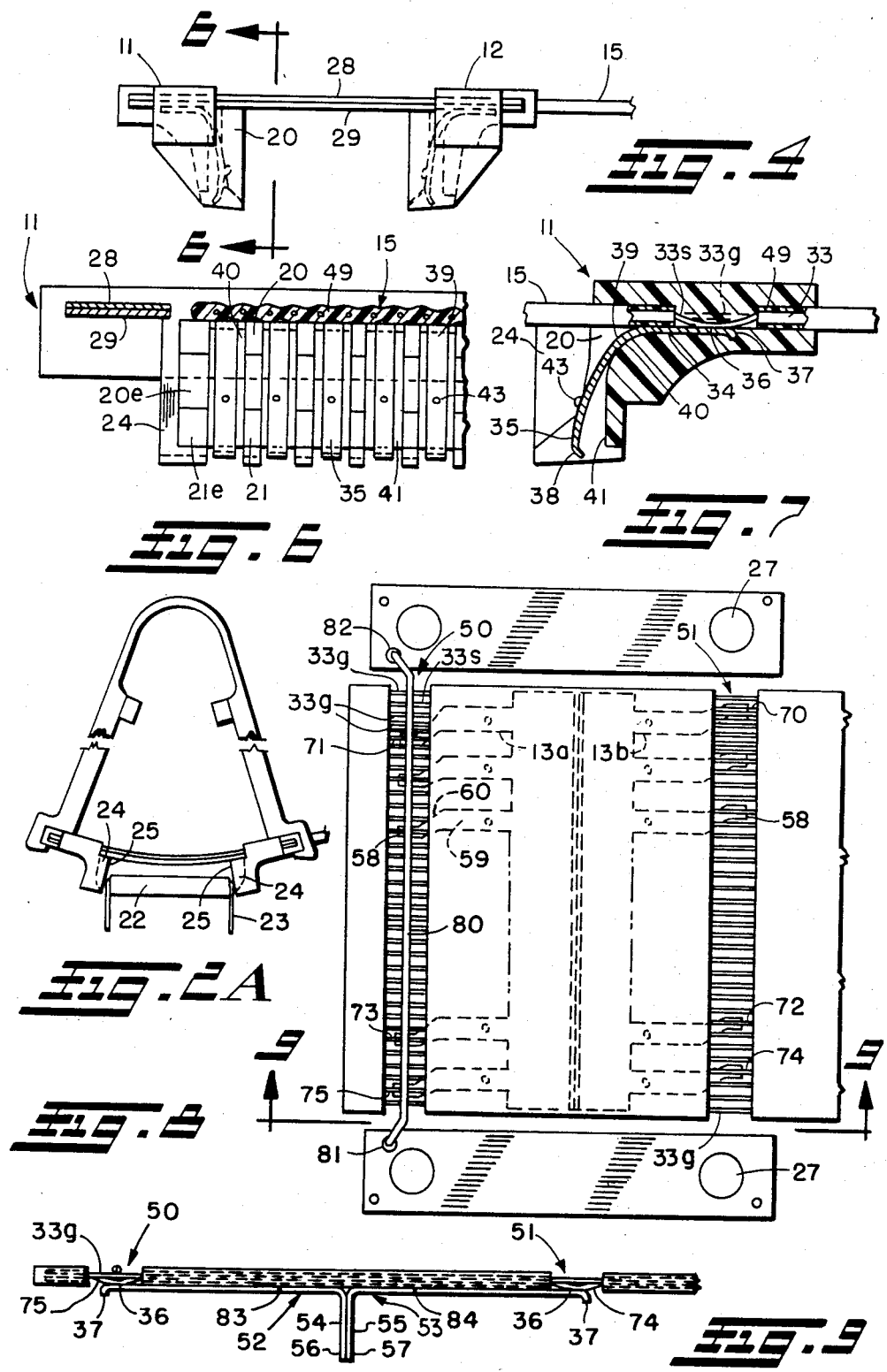

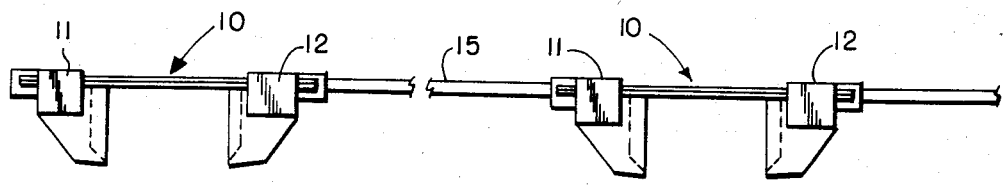
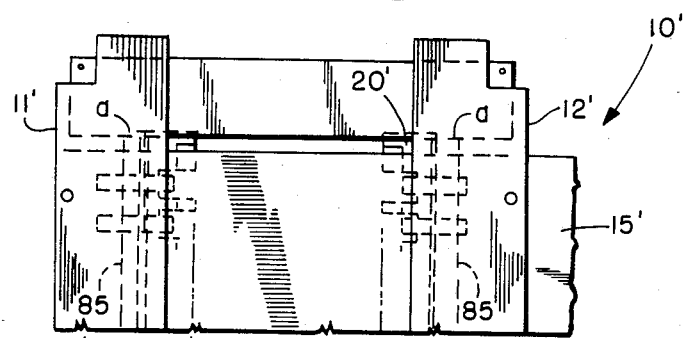
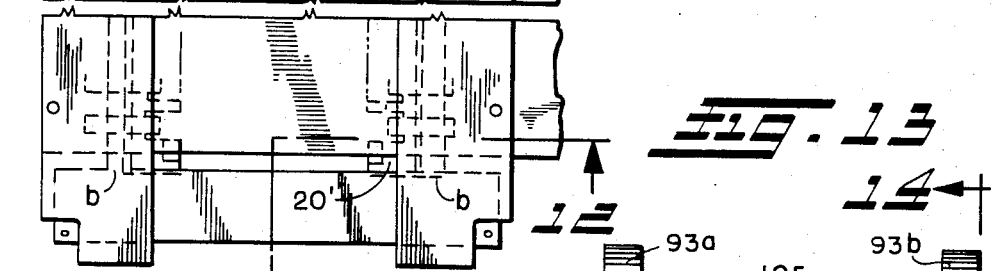
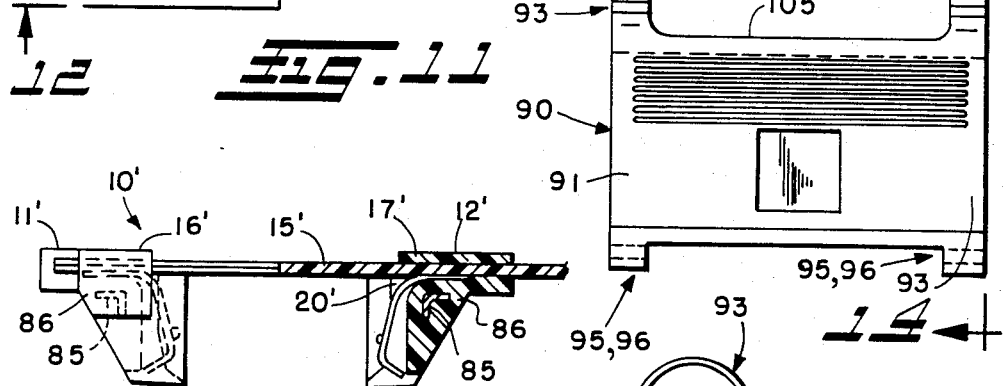
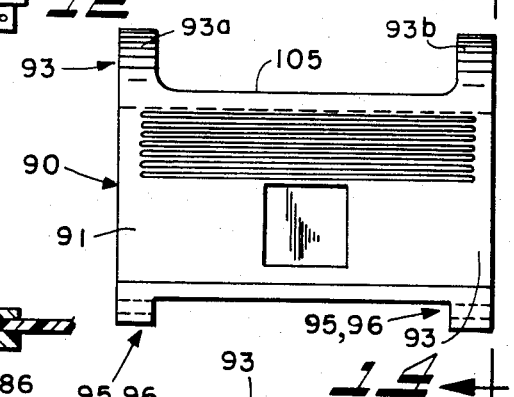
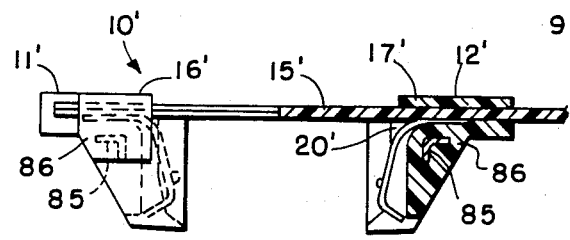
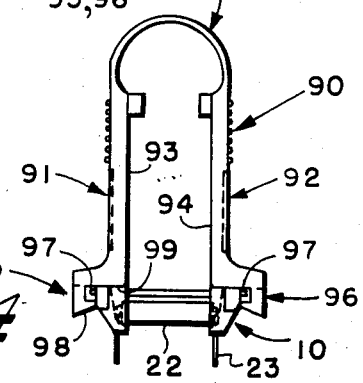

LOW PROFILE TEST CLIP AND HANDLE THEREFOR

DISCLOSURE

The invention herein disclosed relates generally to test clips for electrical and electronic components and, more particularly, to such test clips that have a low profile to facilitate placement in confined areas and to minimize antenna effect. Still more particularly, the invention relates to improvements in test clips of the type disclosed in Morgan et al U.S. patent application Ser. No. 539,121, filed Oct. 5, 1983 and entitled "LOW PROFILE TEST CLIP", now U.S. Pat. No. 4,547,028, and to an improvement in a handle utilized to manipulate such type of test clips.

BACKGROUND

In the above-identified U.S. patent application Ser. No. 539,121 there is disclosed a low profile test clip which has particular application for interconnection with the input/output leads of an electrical component or device, such as an integrated circuit package, for the purpose of attaching test equipment to the leads thereof arranged in plural rows consisting of 14, 16, 32 or 40 leads, for example. The test clip comprises an electrical cable including plural electrical conductors, a pair of clip bodies molded to the cable, each clip body including plural electrical contacts having exposed contacting portions for engaging respective leads of the electrical device and mounting portions about which the clip body is molded and which are electrically connected to respective conductors of the cable at a portion thereof from which the cable insulation has been removed, and a coupling mechanism for coupling the pair of bodies with respect to each other for mounting th test clip to the electrical device with respective electrical contacts engaged with respective leads of the device. The utilized coupling mechanism includes parallel leaf springs at respective lateral ends of the clip bodies to which the clip bodies are also molded.

The clip bodies each were provided with plural separator walls for separating the lead contacting portions of adjacent contacts and for fitting between respective adjacent leads of the electrical device. At the lower end of the separator walls, inwardly projecting teeth were provided to engage the device securely to hold the clip to the device. As was preferred, the teeth at lateral ends of each body had a lateral width exceeding the spacing between the leads of the device to preclude incorrect mounting of the clip on the device which could result in damage to the device or spurious test results, for example.

Although such test clip has been proven successful and advantageous, several problems have been encountered in its usage. Some breakage of the laterally outer gripping teeth has been experienced. Also, the clip even through misaligned might still have the appearance of having been properly installed because the wide teeth at the lateral ends of the clip bodies would permit partial seating of the clip on the device. Such partial seating may also result in the electrical contacts of the clip engaging leads of the device not located according to specification and hence the undesirable consequences associated with clip misalignment.

Another problem that was encountered was poor electrical connection resulting from oxide films on the leads of the electrical device to which the clip was mounted. One attempt to avoid this problem involved scraping the leads as with a sharp lance, but this was tedious and concern existed for solder shavings falling onto the circuit board and causing a short.

In addition to overcoming the aforenoted problems, it would be desirable to provide for convenient and secure attachment of an external ground to the clip as may be desired in some applications. It also would be desirable to provide an easier to use handle for installing and removing the clip. The previously used handle substantially as shown in the aboveidentified application was considered by some to be too stiff or difficult to squeeze.

SUMMARY OF THE INVENTION

The present invention provides improvements in clips of the aforesaid type, although principles of this invention may also have application in other types of clips as well. One feature of the invention involves the provision of obstructing, locating and reinforcing shrouds which strengthen and protect the laterally outer gripping teeth against breakage and which ensure against misalignment and the false appearance that a not properly seated clip is properly installed. Another feature involves the provision of convenient and secure attachment of an external ground whereas still another feature provides for good electrical connection between contacts of the clip and the leads of an electrical device that might have thereon an oxide film. Yet another feature of the invention provides a less stiff and easier to use handle for installing and removing the clip whereas a further feature of the invention provides for reinforcement of the clip bodies in the proximity of contact supporting walls. The specifics of these features will become more apparent from the following description.

To the accomplishment of the foregoing and related ends, the invention, then, comprises the features hereinafter fully described in the specification and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 1 is a partial isometric view, partly broken away in section, of an improved low profile test clip according to the invention;

FIG. 2 is a partial side elevational/partial sectional view of the test clip of FIG. 1;

FIG. 2A is a side elevational view of the clip being precluded from improper installation in accordance with the invention;

FIG. 3 is a top plan view of the test clip of FIG. 1;

FIG. 4 is a side elevational view of the test clip looking generally in the direction of the arrows 4—4 of FIG. 3;

FIG. 5 is a partial bottom plan view of the test clip;

FIG. 6 is a sectional view of the test clip taken substantially along the line 6—6 of FIG. 4;

FIG. 7 is an enlarged sectional view of one of the body portions of the test clip molded directly to the electrical cable thereof taken substantially along the line 7—7 of FIG. 3;

FIG. 8 is a top plan view of the incompletely formed contacts, electrical cable, resilient body connectors, and ground bus ready for molding with respect thereto of the test clip bodies;

FIG. 9 is an end elevational view looking generally in the direction of the arrows 9—9 of FIG. 8;

FIG. 10 is a schematic view showing plural test clips on a single cable;

FIG. 11 is a top plan view of a modified form of test clip according to the invention;

FIG. 12 is a partial side elevational/partial sectional view of the test clip of FIG. 11;

FIG. 13 is a front elevational view of an improved handle according to the invention for installing and removing the test clip with respect to an integrated circuit package or the like; and FIG. 14 is a side elevational view of the improved handle installed on a test clip according to the invention in turn installed on an integrated circuit package.

DETAILED DESCRIPTION

In the following detailed description reference will be made to a test clip, for according to the preferred embodiment and best mode of the invention, such device is intended for use to test the operability of and the functions of an integrated circuit device and other devices to which such integrated circuit device may be connected. However, it will be appreciated that an electrical connector according to the invention, including the various one or more features thereof, may be used with devices other than integrated circuits and for electrical connection purposes that are other than testing purposes. References to integrated circuit and to integrated circuit package are equivalently used and are intended to be exemplary only of a device to which the test clip of the invention may be connected; preferably such device has a dual-in-line lead configuration to which the test clip contacts conveniently may be connected. Reference to lead herein generally may be construed as a reference to an electrically conductive member, such as a lead or contact associated with a dual-in-line package (DIP) electronic device or other electrical or electronic device to which the test clip of the invention may be connected. Additionally, references to electrical and to electronic may be used equivalently herein.

Referring now in detail to the drawings and intially to FIG. 1, an improved low profile test clip according to the invention is designated generally by reference numeral 10. The test clip 10 includes a pair of electrically non-conductive bodies 11 and 12, a plurality of electrically conductive contacts 13, a connector mechanism 14 for connecting the respective bodies with respect to each other, and a part of an electrical cable 15 to which the bodies are directly molded, as will be described in greater detail below. Preferably the contacts 13 are able to be so closely packed that connections thereof to the cable conductors, such as those of a flat ribbon cable, will not require any spreading of the cable conductors; yet the test clip still will fit properly and conveniently onto an integrated circuit package or the like to engage electrically the respective leads thereof.

The clip bodies 11 and 12 (or body portions as referred to in the above identified application Ser. No. 539,121) preferably are identical. Each body includes an upper or main portion 16, 17 molded to mounting portions of the contacts 13, part of the connector mechanism 14, and part of the cable 15 to form a secure, strong integral structure thereof; and the height of such upper body portion 16, 17 preferably is adequate to provide a strong interconnection and support/holding of such other parts while such height is otherwise preferably minimized to minimize the height profile of the test clip 10. Each clip body 11, 12 also is formed with a plurality of finger or wall-like separators 20 which are integrally molded with the respective upper body portions 16, 17 and function both to separate respective relatively adjacent contacts 13, preferably also to protect the contacts from various damage, to guide the test clip 10 into proper position with respect to the leads of an integrated circuit package, and to hold the test clip on such package. For such purposes, and especially the latter two, jaw-like teeth 21 protrude from the bottom of each separator 20.

In FIG. 2, the gripping function that such teeth 21 may provide with respect to an integrated circuit package 22 is shown. Moreover, in FIG. 3, the relative orientation of the teeth 21 and separators 20 for separating and positioning purposes is shown. Preferably the separators 20e and teeth 21e at the respective lateral ends of the group thereof associated with a respective clip body 11, 12, i.e. most proximate the lateral ends 11e, 12e thereof, are wider in the lateral direction than are the other separators and teeth therebetween. Such wider members 20e, 21e are too wide to be inserted between a pair of leads 23 of the integrated circuit package 22 and, therefore, serve to prevent the test clip 10 from being positioned in a misaligned position with respect to such leads. The other separators 20 and feet 21 are of a narrower width so as to fit in the space between adjacent leads of an integrated circuit.

As above indicated, there was experienced some breakage of the laterally outer teeth in clips substantially as shown in the above-identified application. Also, the wider outer separators and teeth of such prior clip design would still permit partial though limited seating of the clip on the integrated circuit which might still give the visual appearance and feel that the clip was properly installed when actually not properly installed.

In accordance with the present invention, these and other problems are avoided by a shroud added at each laterally outer separator 20e and tooth 21e as seen as 24. Each shroud is located laterally outwardly adjacent the respective wide separator 20e and protrudes therefrom along the full height thereof and by a distance preferably about equal the extent of protrusion of the tooth 21e on the respective separator. The shrouds 24 overlap the outer teeth 21e and function to strengthen and protect the outer teeth 21e against breakage, preferably to guide the test clip 10 into proper position on an integrated circuit, and to prevent the test clip from being even partially seated on the integrated circuit in what otherwise might feel and even visually appear to be a properly installed position when actually in a partially seated and misaligned position with respect to the leads of the integrated circuit. As illustrated in FIG. 2A, the inner walls 25 of the shrouds at either of the ends of a misaligned test clip will engage and interfere with the adjacent upper corners of the body of the integrated circuit package 22 to keep the clip from closing around the integrated circuit package and the clip contacts spaced off of the leads 23 of the integrated circuit. Only when the test clip is properly installed will the shrouds clear the lateral ends of the integrated circuit to permit proper seating, positioning and gripping of the clip on the integrated circuit. The lateral spacing between the laterally inner walls 26 of the shrouds of each clip body may correspond to the corresponding dimension of the integrated circuit and thereby serve to provide an additional locating function of the test clip on the integrated circuit by engaging opposite lateral end faces of the integrated circuit.

The coupling or connector mechanism 14 provides both the means to hold the clip bodies 11 and 12 in position relative to each other and to enable relative pivoting, folding out or rotational type of movement of such bodies, for example as the connector mechanism is flexed or otherwise preferably resiliently deformed. Such flexure tends to move the teeth 21 of one clip body away from the teeth 21 of the other clip body to open the space therebetween and between respectively opposed contacts 13 carried by the respective clip bodies 11 and 12 to facilitate inserting or installing the test clip 10 onto an integrated circuit package 22, for example, as is shown in FIG. 2; such flexure also facilitates removing the test clip 10 from an integrated circuit package. Moreover, the connector mechanism 14 preferably is resilient so that after such flexure, the clip bodies 11 and 12 will be moved back into the relative positions to each other illustrated in FIGS. 1 and 2 under the influence of the connector mechanism.

After being installed on an integrated circuit package 22, as is shown in FIG. 2, the test clip 10 securely holds to such package. The resilient urging of the connector mechanism 14 causes the contacts 13 and preferably the teeth 21 to engage, respectively, the leads 23 and body of the integrated circuit package to effect such holding function.

The connector mechanism 14 is comprised of two pairs of metal, e.g. spring steel, springs 28, 29, which operate as stacked leaf springs, one pair at each lateral end of the test clip 10. Each of the leaf springs 28, 29 has openings 27 (FIG. 8) at the opposite ends thereof to enable material of the respective clip bodies 11 and 12 to be molded therethrough securing the springs thereto. A leaf spring arrangement provides firm relative positioning of the clip bodies 11 and 12 and yet provides the desired resiliency, both while minimizing the amount, such as thickness and width, of material and stiffness of the individual leaves of the composite leaf spring required. Therefore, using leaf springs 28 and 29 in the connector mechanism 14 further is conductive to the low profile configuration of the test clip 10.

The leaf springs 28 and 29 of the connector mechanism 14 are in or approximately in the plane of the cable 15, and this still further contributes to the ability to minimize the profile height of the test clip 10. Such minimum height tends to reduce antenna effect. However, if desired, the height of the upper body portions 16 and 17 may not be raised slightly to accomodate a sheet-like metal spring totally across the top of the cable 15 between the clip bodies 11 and 12 or below the cable between the cable and the integrated circuit package, for example, thus providing a shielding function and further minimizing undesirable antenna effect.

As seen in FIGS. 1, 3 and 5, the outer corner at each lateral end 11e, 12e of each clip body 11, 12 is recessed at 30 to expose the adjacent corner section 31 of the leaf springs 28 and 29. Preferably, each exposed corner section 31 of the leaf springs is provided with a through hole 32 for easy and secure attachment of an external ground. That is, a ground wire clip, such as of the "easy hook" type, may be conveniently positioned and secured at any one such exposed corner of the leaf springs at the hole therein to effect an external ground connection for the test clip when desired. As discussed below, the leaf springs may be connected by a ground bus wire to ground conductors of the cable 15.

The contacts 13, are intended to be relatively compliant to accommodate effective electrical connections with leads of integrated circuits or other devices in which the actual lead positions are not always located according to specification. As is seen in FIGS. 1 through 7, the contacts are of a configuration that provides a multiplicity of functions. Each contact 13 is intended to provide an electrical connection between a respective conductor 33 of the cable 15 and a respective lead 23 of the integrated circuit package 22. For this purpose, each contact 13 has a mounting portion 34 and a contacting portion 35 for respectively connecting electrically with such conductor 33 and lead 23. The cable 15 is secured in the clip bodies 11 and 12 to extend generally parallel to a printed circuit board or the like onto which the integrated circuit package 22 may be mounted, thereby minimizing the space required for the cable, especially by avoiding any need to bend or to twist the cable when bringing it out from the test clip 10 and integrated circuit 22. This arrangement minimizes space requirements for the test clip 10 and cable 15 and also minimizes potential damage to the cable and/or other components while further minimizing possible antenna effect due to a distorted cable.

To enable such cable 15 to be brought out in parallel to such a printed circuit board, while minimizing the height of the clip bodies 11 and 12, the mounting portion 34 of each contact 13 extends in a generally parallel direction with the conductors 33 and cable. Each mounting portion is connected at a junction 36 to a respective conductor 33 by soldered connection thereto. At the end of the contact mounting portion is a downwardly turned or bent tab 37, the purpose of which is to help secure or anchor the contact in the molded material of the respective clip bodies 11 and 12.

The contacting portion 35 of each contact 13 preferably is smoothly curved or bowed over the major extent thereof to facilitate smooth sliding, wiping and bending thereof with respect to a lead 23 as the test clip 10 is installed or removed with respect to an integrated circuit package 22. Such bending preferably ordinarily would be within the resilient limits or elastic limits of the contacting portion 35 to avoid overstressing the contact to an undesirable permanent shape, such as one that would not assure the desired wiping and resilient engagement with a lead 22. Preferably each contacting portion 35 for the most part is recessed below the inner edge of each of the relatively adjacent separators 20 to protect the contacting portions from external stresses, contamination, and the like before and during installation on an integrated circuit 22. At the remote end of the contacting portion 35 is an inwardly, i.e., toward the center of the radius of curvature of the contacting portion, bent tab 38. The tab 38 functions to avoid a sharp end at the end of the contacting portion which could damage a lead 23 or a user of the test clip 10. The tab 38 also protects the contact 13 itself by preventing the end of the contacting portion from biting into a lead and becoming lodged therein so as to cause a permanent bending distortion of the contact 13 on continued application of force thereto during installation on an integrated circuit package 22.

A curved intermediate portion 39 of each contact 13 joins the mounting portion 34 and the contacting portion 35. The intermediate portion 39 maintains the continuity of curvature of the contacting portion 35, while providing a smooth transition to the mounting porition, which extends generally perpendicularly with respect to the major directional extent of the contacting portion and in any event generally in parallel with the conductors 33 and cable 15. Moreover, the curved intermediate portion cooperates with a curved wall surface 40 of the clip body 11, 12 between relatively adjacent pairs of separators to allow bending of the contact 13 minimizing stress concentrations and preventing overstressing thereof. The wall surface 40 is curved to an extent that permits relatively free bending of the contact 13 contacting portion 35 and, particularly, the intermediate portion 39 during normal installation and removal of the test clip 10 relative to an integrated circuit package 22 without overstressing the contacts beyond their elastic limit. The clip bodies also have back-up wall surfaces 41 extending from and located below the curved wall surfaces 40, recessed relative to the separators 20, and positioned behind the respective contacting portions 35 of the contacts to limit the maximum bending of the contacts to prevent possible overstressing during use, including the aforesaid installation and/or removal. The permissible bending of the contacts 13 and the limiting of such bending by the walls 40, 41 provides a relatively high degree of contact compliance. The radius or curved wall 40 allows a relatively large deflection of the contact 13 for maximum movement of the contacting portion 35 toward or away from a lead 23, for example, before the contacting portion bottoms out against the wall 41.

In accordance with the present invention, a protrusion or bump is formed on the contacting portion 35 of each contact 13 as best seen at 43 in FIGS. 6 and 7. The inwardly protruding bump 43, which preferably is hemispherical, functions to break through oxide film or dirt on a respective lead of an integrated circuit package, and to provide a point-like connection between the contact and lead instead of a wide surface area connection. The provision of the bump on each contact eliminates the need to scrape the leads of the integrated circuit while on the other hand providing an electrical connection of high integrity.

The cable 15 preferably is a flat ribbon type cable having plural electrical conductors 33 arranged in parallel positional relation and held so and in electrical isolation by the cable insulation 49. According to the preferred embodiment and best mode of the present invention, such cable 15 is that known as trasmission line cable intended for high speed signal transmission; and in such case each signal conductor 33s is bounded on both sides thereof by respective ground conductors 33g. Other types of flat ribbon cable or other cable also may be used.

To form a junction connection 36 between a respective conductor, such as one of the signal conductors 33s, and the mounting portion 34 of a contact 13, a portion of the insulation 49 is removed at an area 50 or 51 of the cable (FIGS. 8 and 9) to expose the conductors, and the particular conductor intended for such connection is deformed slightly downwardly out of the major planar, linear or axial extent of the cable and conductors therein, for example, as is shown in FIG. 7. The junction connection 36 is completed by soldering together the deformed conductor portion and the contact mounting portion 34, thereby forming a secure mechanical and electrical connection thereof. Therefore, those conductors 33 that are to be connected to respective contacts 13 carried in the clip body 11 are bent or deformed down at the area 50 of the cable where the clip body 11 is to be molded to form such respective junction connections 36; and for those conductors 33 intended to form junctions with contacts 13 carried in the clip body 12, they are so deformed at the area 51 of the cable 15 where the clip body 12 is to be molded. In this manner relatively close packing of the contacts and the conductors can be accomplished, and the contact spacing can be such that will conform to the spacing of the leads of the integrated circuit package 22, as will be described further below. Those conductors 33, such as ground conductors 33g, which are not to be connected to a respective contact at one of the clip bodies 11 and 12 are not so downwardly deformed and, therefore, are maintained out of connection with respective contacts.

After the respective junctions 36 have been so formed between respective contacts and conductors, the respective clip bodies 11 and 12 are molded directly to and about such junctions, part of the cable insulation 49 and exposed conductors at such areas 50 and 51 of the cable where the insulation had been removed, and part of the contacts 13. The clip bodies 11 and 12 form an hermetic seal about the junctions to prevent air and moisture from reaching the same and causing any corrosive or elecrolytic action that could reduce the efficiency of the electrical connection thereof. The cable, junctions and contacts, then, become an integral included part of the clip body, thus forming a strong mechanical structure with high electrical connection and insulation integrity. In one embodiment, during such molding the insulation of the cable may form a chemical bond with the molding material, preferably of plastic or plastic-like material, of the clip body for strain relief. However, due to the deformation of the conductors, the mechanical connection thereof to respective contacts, and the molding of the clip bodies about such deformed conductors and such junctions, effective strain relief also is achieved thereby.

In FIGS. 8 and 9, parts of the low profile test clip 10 are shown in position relative to each other ready for molding thereabout of the respective clip bodies 11 and 12. At areas 50 and 51 insulation 49 has been removed to expose the parallel conductors 33 in the cable 15. Such conductors include ground conductors 33g and signal conductors 33s. At the upper portion of FIG. 8 the illustrated conductor configuration can be seen to include a ground conductor 33g at the edge of the cable, a signal conductor 33s adjacent and parallel to such ground conductor, a pair of ground conductors 33g parallel to and spaced away from the first-mentioned signal conductor, the next signal conductor, etc., whereby a separate pair of ground conductors is provided for each signal conductor in the cable. At the lower two-thirds of the cable shown in FIG. 8, only a single ground conductor is shown between adjacent signal conductors in order to avoid cluttering of the drawing, but it will be appreciated that such illustrated single ground conductors may represent a pair thereof in the fashion shown at the upper portion of FIG. 8. It will be appreciated, though, that other conductor and cable configurations may be employed.

As is seen in FIGS. 8 and 9, the contacts 13 are formed by cutting the same, for example by die cutting, from one of two sheets of material 52 and 53, whereby respective pluralities of contacts 13 are supported by respective carrier strips 54 and 55. The sheets 52 and 53 also preferably are bent to form the tabs 37 and respective handles 56 and 57, which facilitate proper placement of the contacts 13 relative to the conductors 33 during the soldering operation to form the junctions 36 and during the molding operation to form the clip bodies 11 and 12. Each of the contacts 13 has a connecting end 58 forming at least part of the mounting portion 34. The connecting end and the other parts of the contact 13 may be of the same or different lateral widths. However, as illustrated, the connecting end 58 is of smaller width than other portions of the contact to facilitate close packing without short circuits relative to the conductors 33. Each contact 13 is shown with a relatively wider portion 59 (FIG. 8) to maximize the surface area of the intermediate portion 38 and contacting portion 35 for strength, durability, compliance and available area for engagement with a lead 23 of an integrated circuit 22. The connecting end 58 is offset from the contacting portion 59 to expose an edge surface 60 of the contact essentially out of the plane (as it is seen in FIG. 8) beyond the edge of portion 59, and such edge surface 60 has a vector component that faces the direction of and opposes forces that would tend to pull the contact, say in either direction approximately parallel to the direction of the cable 15, from the molded body portion. Thus, the edge surface 60 may be cooperative with the molded material of a clip body 11, 12 further to enhance strain relief for the contact 13 and for the junction 35 of the contact and conductor with respect to a clip body 11, 12.

Preferably the sheets 52 and 53 are identical, but being used in paired opposition with handles 56 and 57 abutting each other. The connecting ends 58 of the sheets 54 and 55 effectively are displaced, respectively, in opposite directions. Therefore, an opposite pair of contacts, such as those identified 13a and 13b of respective sheets 52 and 53 are in parallel opposed alignment with each other for engaging the paired opposed parallel leads 23 on opposite sides of an integrated circuit package 22 while the respective connecting ends 58 of such paired opposite contacts 13a and 13b are offset to form electrical junctions 36 with relatively adjacent signal conductors 33s. Thus, for example, the signal conductor 33s, which also is identified by the reference numeral 70, is aligned for electrical connection with the contact 13b; such conductor 70 also continues to pass through the cable, e.g., to the left hand direction as is seen in FIG. 8, but does not align with the connecting end 58 of the contact 13a. However, the signal conductor 33s identified by reference numeral 71, which is the next signal conductor adjacent the one identified by reference numeral 70, passes through the cable for alignment with the connecting end of the contact 13a but without engaging the connecting end 58 of the contact 13b, and so on. Other signal conductors 72 through 75 are similarly represented in FIG. 8 aligned for connection with respective contacts 13 carried by the respective carrier strips 54 and 55.

Those conductors 33 which are intended to form junctions 36 with the narrow connecting ends 58 of respective contacts 13 are deformed downward out of the major planar or axial extent of the conductors, for example, as is seen at conductors 74 and 75 in FIG. 9. To facilitate forming soldered connections at such junctions 36, the connecting ends 58 may have a coating of solder already placed thereon prior to assembly in the manner shown in FIGS. 8 and 9. After such assembly, heat, hot vapor, or other means may be employed to re-flow such solder to form soldered connections of respective contacts and conductors at junctions 36.

If desired, all or selected ones of the ground conductors 33g may be electrically connected in common using a wire 80 as a grounding bus therefor. Such wire 80 is adjacent the cable area 50 intended for enclosure in the clip body 11, and at such area it will be necessary to deform out of the plane of the wire bus 80 all of the signal conductors to avoid short circuiting thereof to ground. However, due to the offset configuration of the narrow connecting ends 58 of the contacts 13, the downward deforming of those signal conductors which are not intended to be connected to contacts supported on the carrier strip 54 will not engage such contacts thereby maintaining desired electrical isolation. (The molded body portion about the junctions 36, contact mounting portions 34 and conductors 33 also helps maintain such isolation.) If desired, the ground conductors 33g may be deformed upwardly out of the major plane or axial extend thereof to engage the ground bus wire 80 in further isolation from all of the signal conductors 33s. The ground bus wire 80 may be pre-coated with solder that may be reflowed using conventional techniques, such as heat, vapor, etc., to form soldered connections with the respective ground conductors 33g. Additionally, the connector mechanism 14, specifically the individual leaf springs 28 and 29 thereof, are mechanically and electrically attached to the wire bus 80, for example by connecting the wire through holes in such springs, as is shown at 81 and 82 in FIG. 8, to enhance the overall ground plane isolation, noise shielding and antenna effect minimization characteristics of the test clip 10, as well as to provide for an external ground connection as above discussed.

After the parts illustrated in FIGS. 8 and 9 have been assembled in the manner illustrated therein and described above, the clip bodies 11 and 12 may be directly molded thereto. The bodies preferably are of electrically non-conductive plastic or plastic-like material and are molded using a plastic injection molding process. Such bodies form hermetic seals about the respective junctions 36, preferably integrally bond to the cable insulation 49, and position the respective wall surfaces 40 and 41 relative to the exposed portions of the contacts 13, such as the contacting portion 35 and intermediate portion 39 thereof while the mounting portion 34 of each contact is secured in the molded body. After such molding, the handles 56 and 57 of the respective contact carrier strips 54 and 55 may be bent in a downward rotating fashion to bend the intermediate and contacting portions of the contacts to the shape illustrated generally in FIGS. 1, 2, 4, and 7. The carriers 54 and 55 then may be broken away or off from the contacts 13 at break-away lines 83 and 84, which may be scored into the surface of the sheets 52 and 53 during the formation thereof, thereby simultaneously forming the tabs 38 and electrically separating the individual contacts 13 from each other. The actual shapes of the wall surfaces 40 and 41, and the manner in which the bending forces are applied to the contacts via the carrier strips 54 and 55 will determine the shapes or curvatures of the intermediate and contacting portions 38 and 35. Preferably such portions are curved in the manner shown. However, it may be the case that the contacting portion has more a linear extent than a curved one, and this configuration may be acceptable as long as the overall formation is such that the test clip can be inserted and removed with respect to the leads of an integrated circuit package making good electrical connection with such leads without damaging the same or the contacts (tabs 38 help avoid the possibility of such damage).

It will be appreciated that the test clip 10 may be located at or near an end portion of the cable 15 or at a portion of the cable intermediate the ends thereof. The remainder of the cable may be a "brought out" to another device for electrical connection thereto, such as a test device, signal injector, etc. Moreover, one or more test clips 10 may be formed on a single cable 15 at respective axial positions therealong to effect an interconnection via the cable of a plurality of integrated circuits or the like, whereby such test clips and cable also may form a parallel bus or daisy chain type device. Such an arrangement is shown in FIG. 10.

In FIGS. 11 and 12, wherein primed reference numerals designate elements corresponding generally to those identified above by the same unprimed reference numerals, a modified test clip according to the invention is designated generally by reference numeral 10'. The test clip 10' may be substantially the same as the above described test clip 10, but further is provided with a reinforcing member such as angle 85 in each clip body 11', 12'. The reinforcing angle 85 may be of the illustrated L-shape and is made of metal and preferably a light weight metal such as aluminum. The angle 85 is molded in the depending part 86 of the upper body portion 16', 17' of the respective clip body to which the separators 20' are integrally joined. The angle 85 extends laterally at least about the lateral extent of the separators 20' as between points "a" and "b", functions to stiffen the clip body without adding to the cross-sectional size of the clip body as might otherwise be required, and is of particular use in wide clip bodies such as those of a 64-pin or more test clip.

Referring to FIGS. 13 and 14, a handle 90 for installing and removing the test clip 10 with respect to an integrated circuit package 22 includes a pair of handle grips 91 and 92 which are connected by a resilient strap 93. The strap 93 faciltates manipulation of the handle 90 and, in particular, use thereof with respect to the test clip 10, for example for effecting the resilient biasing of the grips 91 and 92 to the positions shown when not connected to a test clip. The strap 93 may be secured to the grips 91 and 92 by molding therewith.

Each of the grips 91 and 92 has a pair of elongate arms 93 and 94 that support jaw-like portions 95 and 96 at the ends thereof. Each jaw has a configuration providing for a slotted area 97 formed between a lower tooth 98 and an upper surface 99, and such jaws preferably are located only at respective opposite lateral ends of the grips 91 and 92 (as is seen in FIG. 13). The jaws fit over the respective lateral edges 100 and 101 (FIG. 3) of the clip bodies 11 and 12 to grip the same securely. To that end the slots 97 preferably are approximately just slightly larger than the height of the respective lateral edges of the clip bodies as shown in FIG. 12, whereby the handle grips 91 and 92 effectively become mechanical extensions of the bodies 11 and 12 to form a close fit therewith. Since the jaws are at the lateral ends of the grips 91 and 92, when such grips are placed on the bodies 11 and 12, such jaws align substantially directly with the leaf springs 24 and 25. Accordingly, as force is applied by the handles to the body portions tending to pivot, twist or rotate the same, thus resiliently distorting the leaf springs 28 and 29, substantially direct force will be applied to such leaf springs while effecting a compression of the proximate parts of the bodies 11 and 12 and minimizing other forces and stresses to such body portions, thereby maintaining the physical integrity of the test clip during such force application.

Using the handle 90 to install the test clip 10 on an integrated circuit package, the jaws 95 and 96 are placed on the test clip in the manner illustrated in FIG. 14. Force is applied to the arms 93 and 94 tending to move them toward each other to rotate or to pivot the bodies 11 and 12 enlarging or opening the space between the teeth 21 of the opposed body portions. The space between opposed contacts 13 also is opened, and the test clip 10 may be inserted downward onto an integrated circuit package, for example in the manner illustrated in FIGS. 2 and 14. During such insertion or installation, the contacts 13 engage leads of the integrated circuit, preferably resiliently deform with respect to such leads, and wipe or rub against such leads at the protruding bumps 43 to clean the interengaged surfaces and to enhance electrical connection.

After such insertion or installation, the force applied to the arms 93 and 94 tending to force the same together is released, whereupon the resilient connector mechanism 14 will tend to return the bodies 11 and 12 back to original position closing the space between the teeth 21. The teeth 21 then preferably engage and grip the integrated circuit package holding the test clip 10 thereto while the contacting portions 33 of the contacts 13 engage at the bumps 43 respective leads 23 of the integrated circuit package. After such installation, the handle 90 may be removed from the test clip 10. To remove the test clip 10 from an integrated circuit package, the handle may be re-connected to the test clip. Force applied to the arms 93 and 94 tending to press the same toward each other effects the desired pivoting and space-opening effect of the clip bodies 11 and 12 facilitating the freeing and removing of the test clip 10 from the integrated circuit.

In order to render the handle easier to use for installing and removing the clip 10 as by reducing the stiffness thereof to squeezing upon application of force to the arms 93 and 94, the resilient strap 93 is provided with one or more openings at the central arcuate portion thereof and preferably one laterally centered, large opening or cut-out as indicated at 105. The opening 105 consequently defines two relatively narrow, parallel strap portions 93a, 93b at respective sides of the handle which are easier to bow or deform than a continuous wide resilient strap, and thereby provide for a reduction in the force needed to rotate or pivot the clip bodies during installation or removal of the clip.

Although the invention has been shown and described with respect to a prferred embodiment, it is obvious that equivalent alterations and modifications will occur to others skilled in the art upon the reading and understanding of this specification. The present invention includes all such equivalent alterations and modifications, and is limited only by the scope of the following claims.

I claim:

1. A low profile clip connector, comprising an electrical cable including plural electrical conductors; a pair of electrically non-conductive clip bodies molded to said cable, each body including therein plural electrical contacts having first portions electrically connected to said electrical conductors of said cable and second portions exposed for engaging the leads of an electrical device, and each body including electrically non-conductive separator walls laterally spaced apart and positioned to separate said second portions of said contacts from one another, said separator walls having a spacing and width that permits positioning thereof between the leads of the electrical device; and coupling means for coupling said pair of bodies with respect to each other for mounting of the clip connector on such electrical device to enable said contacts at their second portions to connect with the leads of the electrical device; and each clip body further including therein metal reinforcement means extending substantially the lateral extent of said separator walls for ridigfying said clip body along its lateral length.

2. A low profile clip connector installable on an electrical device including a body and plural electrically conductive leads arranged in rows along respective opposite sides of the body, said connector comprising:

an electrical cable including plural electrical conductors;

a pair of electrically non-conductive clip bodies each fixedly joined to said cable at respective locations along its length, each clip extending laterally with respect to said cable and including therein a plurality of electrical contacts arranged in a row extending laterally with respect to the length of said cable, said contacts having first portions electrically connected to said electrical conductors and second portions inwardly exposed for engaging leads of the electrical device, and said clip body including a row of inwardly protruding separator walls substantially equally laterally spaced apart and positioned to separate said contacting portions of said contacts from one another, said separator walls having a spacing and width that permits positioning thereof between the leads of the electrical device; and coupling means for coupling said pair of clip bodies with respect to each other for relative outward movement away from each other to enable insertion of the electrical device therebetween and relative inward movement towards each other to engage said contacts at their second portions with the leads of the electrical device; and each clip body further including shroud means laterally outwardly adjacent each end of the row of said contacts and protruding inwardly beyond said separator walls to prevent incorrect installation of the clip connector on the electrical device by interference between said shroud means and the body of the electrical device.

3. A clip connector as set forth in claim 2, wherein each clip body further includes at each lateral end thereof an inwardly protruding outermost wall spaced from an adjacent one of said separator walls at a distance substantially equal said spacing of said separator walls.

4. A clip connector as set forth in claim 2, wherein said clip bodies are molded to said cable and around electrical connections between said electrical contacts and said electrical conductors.

5. A clip connector as set forth in claim 2, further comprising teeth means on said separator walls for engaging the electrical device when the clip connector is installed thereon while said contacts engage the leads of the device.

6. A clip connector as set forth in claim 3, further comprising an outermost tooth protruding inwardly from each outermost wall, each outermost tooth being laterally inwardly adjacent and integral with said shroud means whereby said tooth is strengthened against breakage.

7. A clip connector as set forth in claim 6, wherein the extent of protrusion of each outermost tooth and the extent of protrusion of said shroud means relative to each outermost wall are substantially the same.

8. A clip connector as set forth in claim 6, wherein each outermost tooth and outermost wall each have a width greater than the spacing between leads of the electrical device to resist full seating of the clip connector onto the electrical device when the clip connector is improperly positioned.

9. A clip connector as set forth in claim 6, wherein said shroud means includes an inwardly protruding wall laterally outwardly adjacent each outermost wall and approximately equal in height to the separator walls.

10. A clip connector as set forth in claim 2, wherein said shroud means includes laterally inner wall surfaces extending inwardly beyond said separator walls and laterally spaced to accommodate therebetween the lateral dimension of the body of the electrical device with a close fit.

11. A low profile clip connector for electrical devices that have plural rows of electrically conductive leads, comprising an electrical cable including plural electrical conductors, a pair of electrically non-conductive clip bodies molded to said cable, each body including therein plural electrical contacts having first portions electrically connected to respective electrical conductors of said cable and second portions exposed for engaging respective leads of an electrical device, coupling means for coupling said pair of bodies with respect to each other for mounting of the clip connector on such electrical device to enable said contacts to connect with the leads of the electrical device, said coupling means including a pair of spring means at respective lateral ends of said bodies, at least one of said spring means being electrically conductive, ground bus means for electrically connecting at least one conductor of said cable to said at least one spring means, and each of said spring means having opposite end portions about which said bodies are molded with an outer portion of at least one body recessed to expose an adjacent outer portion of said at least one of said spring means to provide for attachment of an external ground.

12. A clip connector as set forth in claim 11, wherein said outer portion of said one spring means includes means to interlock with a ground clip to prevent ground clip pull-off.

13. A clip connector as set forth in claim 12, wherein said means to interlock includes a through hole in said one spring means at said outer portion thereof.

14. A clip connector as set forth in claim 11, wherein each spring means includes at least one leaf spring in a plane substantially parallel to said electrical cable.

15. A clip connector as set forth in claim 12, wherein each leaf spring has a hole at each end thereof for passage of molding material therethrough during molding of said clip bodies.

16. A clip connector as set forth in claim 11, wherein said clip connector has a generally rectangular perimeter in a plane parallel to said cable, and said clip bodies are recessed at each respective corner of said clip connector to expose a respective adjacent outer portion of the respective spring means to provide for selective attachment of an external ground at any one of the corners of said clip connector.

17. A clip connector as set forth in claim 2, further comprising protrusion means on said second portion of each contact for effecting substantially point contact with a lead of the electrical device.

18. A clip connector as set forth in claim 17, wherein each protrusion means is hemispherical in shape.

19. A clip connector as set forth in claim 17, wherein each protrusion means is in the form of a bump deformed out of the respective contact.

20. A clip connector as set forth in claim 17, wherein each protrusion means effects substantially point contact with a respective lead of the electrical device.

* * * * *